United States Patent
Mader

(10) Patent No.: US 8,878,051 B2
(45) Date of Patent: Nov. 4, 2014

(54) VACUUM ELEMENT AND METHOD FOR PRODUCING THE SAME

(75) Inventor: Leopold Mader, Neuhofen/Ybbs (AT)

(73) Assignee: LISEC Austria GmbH, Seitenstetten (AT)

( * ) Notice: Subject to any disclaimer, the term of this patent is extended or adjusted under 35 U.S.C. 154(b) by 15 days.

(21) Appl. No.: 13/255,152

(22) PCT Filed: Sep. 23, 2010

(86) PCT No.: PCT/AT2010/000349
§ 371 (c)(1),
(2), (4) Date: Oct. 18, 2011

(87) PCT Pub. No.: WO2011/041806
PCT Pub. Date: Apr. 14, 2011

(65) Prior Publication Data
US 2012/0024375 A1    Feb. 2, 2012

(30) Foreign Application Priority Data

Oct. 5, 2009    (AT) ................. A 1565/2009

(51) Int. Cl.
*H02N 6/00* (2006.01)
*F24J 2/50* (2006.01)
*E06B 3/677* (2006.01)
*H01L 31/048* (2014.01)

(52) U.S. Cl.
CPC ............... *F24J 2/507* (2013.01); *E06B 3/6775* (2013.01); *H01L 31/048* (2013.01); *H01J 2209/26* (2013.01); *Y02E 10/40* (2013.01); *Y02E 10/50* (2013.01); *Y02B 10/10* (2013.01); *Y02B 10/22* (2013.01)
USPC ........................... 136/251; 136/259; 126/704

(58) Field of Classification Search
CPC ... E06B 3/775; H01L 31/048; H01J 2209/261
USPC .................................. 136/251–255
See application file for complete search history.

(56) References Cited

U.S. PATENT DOCUMENTS 5,478,402 A * 12/1995 Hanoka ........................ 136/251
6,297,072 B1   10/2001 Tilmans et al.
(Continued)

FOREIGN PATENT DOCUMENTS

| EP | 0951069 A1 | 10/1999 |
| FR | 2917899 A1 | 12/2008 |
| JP | H1145778 A | 2/1999 |

(Continued)

OTHER PUBLICATIONS

Notice of Reasons for Rejection, dated Feb. 19, 2014, from corresponding JP application.
Translation of Korean Office Action, dated Jun. 17, 2014, from corresponding KR application.
Austrian Search Report, dated Jul. 26, 2010, from corresponding AT application.

*Primary Examiner* — Reema Patel
*Assistant Examiner* — Syed Gheyas
(74) *Attorney, Agent, or Firm* — Young & Thompson

(57) ABSTRACT

For the production of vacuum elements, which optionally contain fittings in the form of at least one solar module (photovoltaic element) and/or a solar collector or a display element, negative pressure is produced in a space between two flat components, in particular translucent or transparent plates, such as glass panes that are bound together via a bead made of sealing material, such that an arrangement that consists of a first component provided with a bead and at a distance therefrom but parallel to the second component arranged therein, is introduced into a vacuum chamber and pressed under vacuum. In this case, an elevated temperature also optionally can be applied to laminate films provided between the components with the components and optionally present fittings.

15 Claims, 4 Drawing Sheets

(56) References Cited

U.S. PATENT DOCUMENTS

Figure 1:
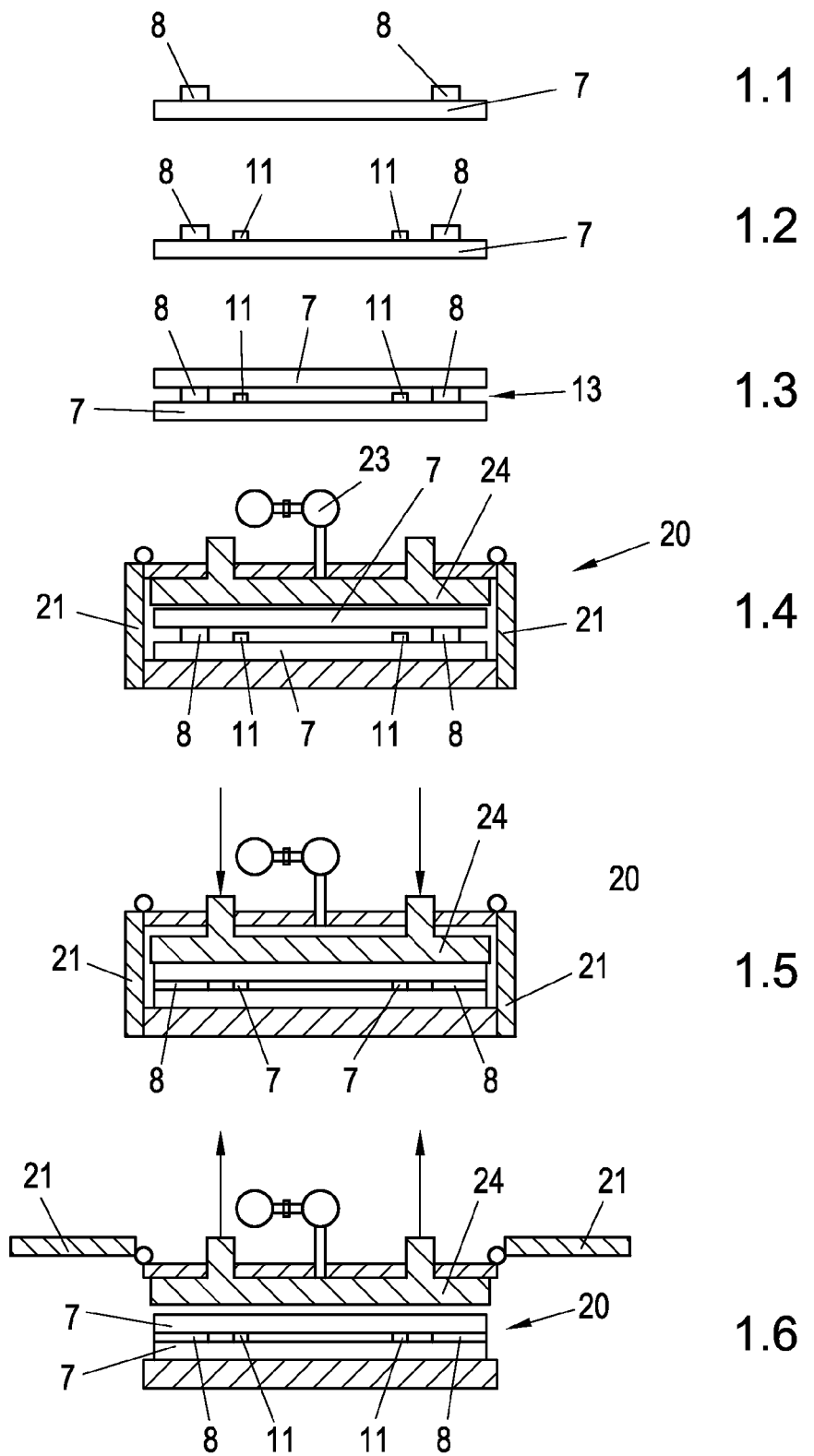

| | | | |
|---|---|---|---|
| 8,119,903 B2 * | 2/2012 | Ito et al. | 136/255 |
| 2008/0023063 A1 * | 1/2008 | Hayes et al. | 136/251 |
| 2008/0230885 A1 | 9/2008 | Wang et al. | |
| 2009/0159117 A1 * | 6/2009 | Ferri et al. | 136/251 |
| 2010/0126560 A1 | 5/2010 | Lauvray et al. | |

FOREIGN PATENT DOCUMENTS

| | | |
|---|---|---|
| KR | 100240289 | 1/2000 |
| WO | 2009/091068 A1 | 7/2009 |

* cited by examiner

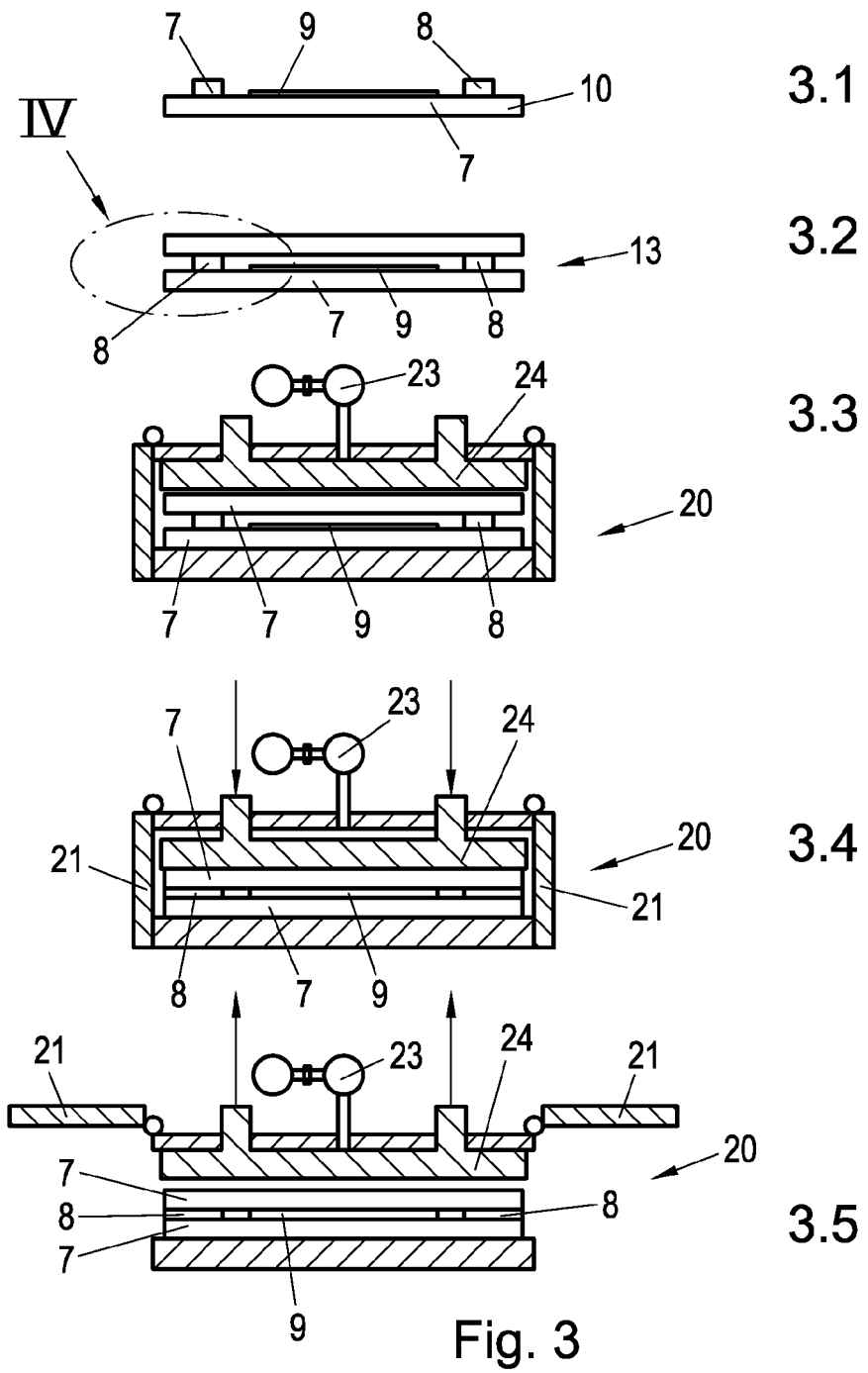
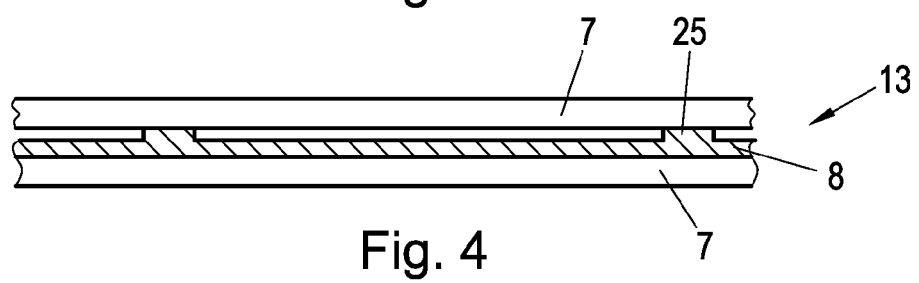
Fig. 3
Fig. 4

VACUUM ELEMENT AND METHOD FOR PRODUCING THE SAME

BACKGROUND OF THE INVENTION

The invention relates to a vacuum element with the below features that is aimed at the element, on the one hand, and a method for producing such elements with the below features that is aimed at the method, on the other hand.

DESCRIPTION OF THE RELATED ART

When producing vacuum elements of the generic type, in most cases the procedure is that air is suctioned off from the interior space of the vacuum element via an opening in the edge seal between flat components.

This is a time-intensive and cumbersome task, in particular since the after-the-fact sealing of the opening through which the vacuum has been applied is cumbersome and deficient.

SUMMARY OF THE INVENTION

The object of the invention is to introduce a vacuum element of the above-mentioned type and a method for producing the same.

By the mode of operation that is proposed according to the invention, on the one hand, and with the design of the vacuum element that is proposed according to the invention, on the other hand, a problem-free production of such vacuum elements is possible, and it is also easily possible to include other components in the vacuum element, whereby such components can be arrangements for converting solar energy into usable energy, e.g., solar modules (for producing electric current) or solar collectors (for producing heat energy), or display elements.

Within the scope of the invention, vacuum elements with different functions are considered. In addition to the above-mentioned embodiments, the vacuum elements according to the invention can also be insulating elements, insulating glass, and data display elements (vacuum elements with built-in display devices, such as screens, monitors, etc.).

In particular, in the method according to the invention and in the vacuum element according to the invention, it is provided that the flat components, at least the component that faces the incident sunlight in the position of use, consist of transparent, in particular translucent, material, in particular plastic or glass or else (nonferrous) metal. For example, it is preferred within the scope of the invention that the glass-hardened glass is, e.g., tempered safety glass.

With the method according to the invention, it is also possible to achieve a secure connection between the individual components of the vacuum element according to the invention by virtue of the fact that between the flat components, a material is introduced that secures these components (fittings) that are bound together and are incorporated in the interior of the vacuum element. Thus, for example, on the inside of at least one of the flat components (in particular glass panes), films, preferably composite films, can be provided. Such composite films, for example single-layer films made of polyvinyl butyral (PVB), have the advantage that the entrance of light, which strikes the solar module (or solar collector) arranged in the interior of the vacuum element, takes place without a transition from an optically thicker medium (e.g., glass) to an optically thinner medium (e.g., air), and reflection, in particular total reflection, is avoided, so that the energy yield is enhanced, since no losses by reflected light occur. Disadvantageous reflections can also be reduced or avoided by the anti-reflective layers applied on the inside of the first component.

As an alternative to the above-mentioned films, the material binding the flat components together can be in the form of a solution (whose solvent is evaporated during assembly) or in the form of a granulate, e.g., a silicone granulate (which melts during assembly).

The method according to the invention for producing vacuum elements essentially comprises the following steps of the method:

A first component (a transparent or translucent flat element, such as a plate, a glass pane, and in particular solar glass) is provided with an edge coating, optionally after pre-lamination. Within the in particular diffusion-tight edge coating, optionally fittings are arranged that can be, for example, a solar module (photovoltaic element) or several solar modules and/or at least one solar collector (from chambers through which in general liquid heat transfer medium flows). The compound that is used for, for example, the edge coating can be a compound that is also used for sealing the insulating glass. In these compounds that can be used for the edge coating, this can generally be a diffusion-resistant adhesive compound. Examples of such adhesive compounds are, i.a., butyl rubber and hot-melt adhesive ("HotMelt," e.g., based on ethylene, vinyl, acetate or polyester). As an alternative, quick-response component adhesives, but also metals that can be soldered with glass, such as tin, can be used.

After this has taken place, optionally after another film, in particular a composite film, is put into place, the second component is put into place, whereby preferably measures are provided that prevent the second component from coming into contact with the bead over the total length of its periphery, so that openings for the release of air from the interior space or the space between the components and the bead are provided all around. This arrangement that is open on the sides and consists of the two components is introduced into a chamber that is optionally evacuated while being heated. Then, the arrangement is pressed and laminated with a vacuum that is held in place, i.e., at a pressure that is below that of the ambient pressure. In this case, it is pressed preferably using a die, which acts upon the entire (outer) surface of the second component. After having been pressed, i.e., after the first and the second components are snugly bound together over the bead of the edge coating all around, whereby it can also be provided that the composite film provided between the optionally introduced fittings and the second component has been laminated between the fittings and the second component, the vacuum is eliminated, and the finished vacuum element can be removed from the vacuum-pressing chamber.

BRIEF DESCRIPTION OF THE DRAWING FIGURES

Figure 2:
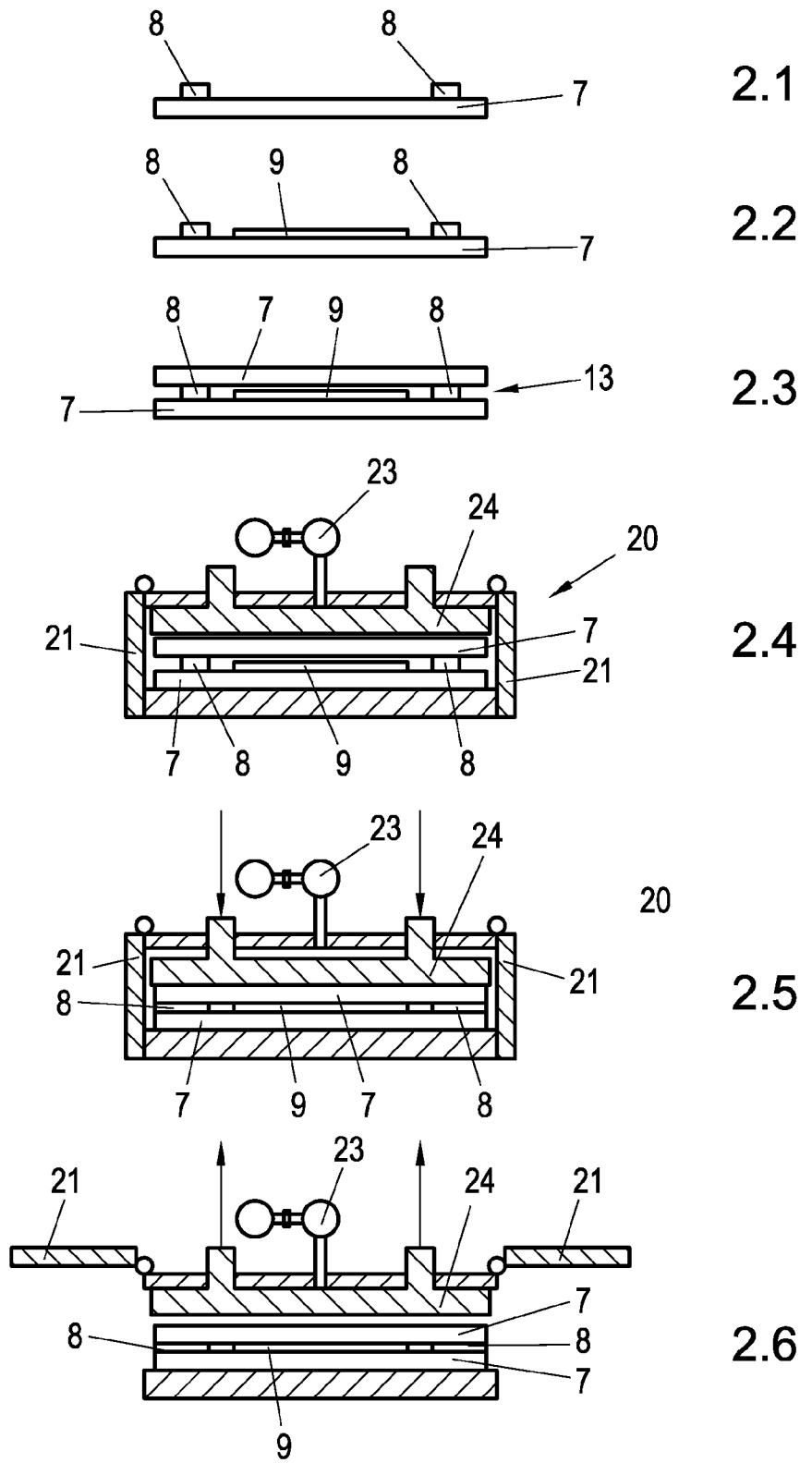
Figure 5:
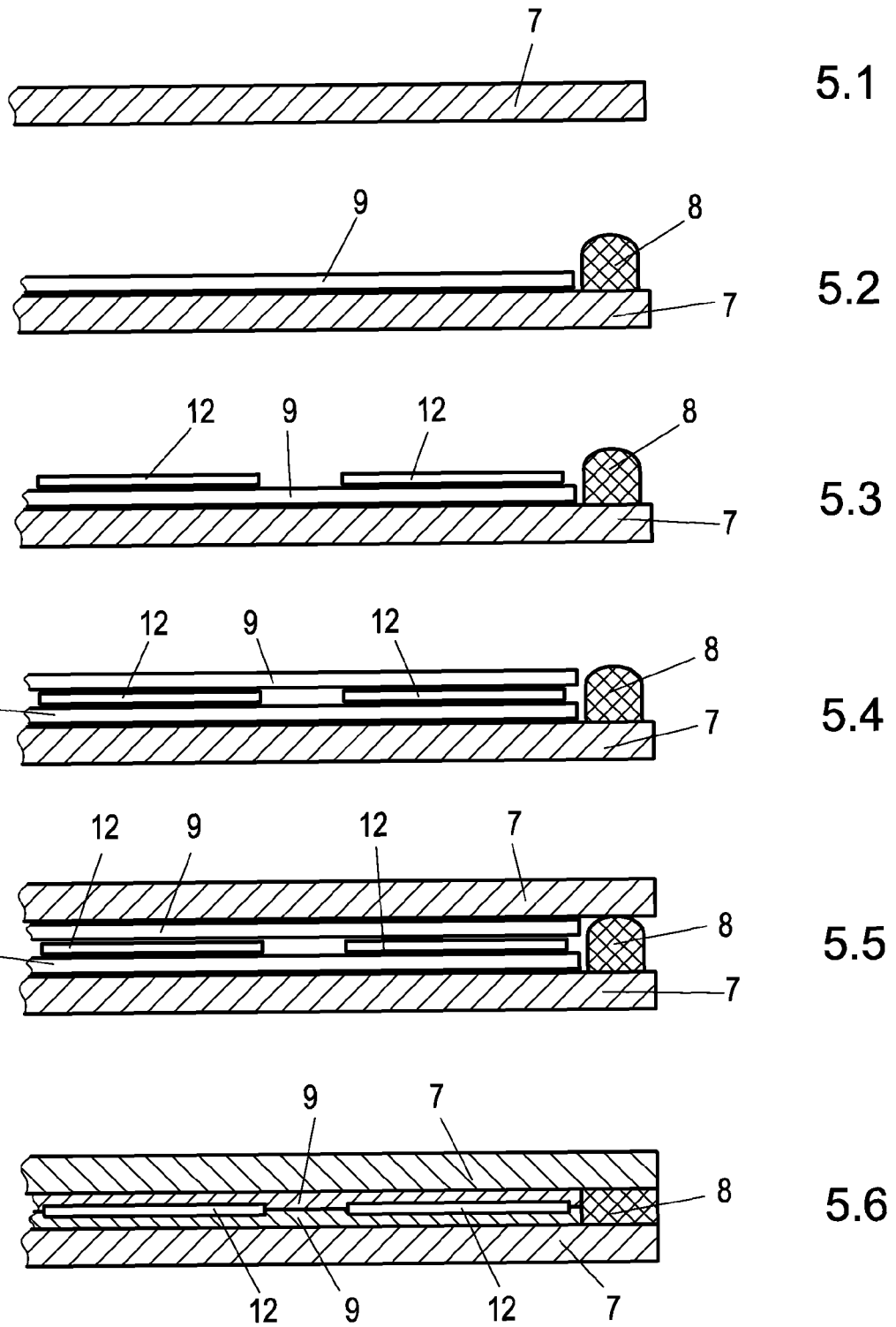

Further details and embodiments of the method according to the invention and the vacuum element according to the invention follow from the description below with reference to the schematic drawings, based on which the process sequence is described when producing vacuum elements according to the invention in three variant embodiments:

Here:

FIG. 1 shows the production of a vacuum element, which can be, for example, an insulating element, a display element or an insulating glass unit, with spacers, in six successive steps, FIG. 2 shows the production of a vacuum element with a solar module (photovoltaic element) in six successive steps, FIG. 3 shows the production of a vacuum element with a solar module designed as a thin-layer-photovoltaic module in five successive steps, FIG. 4, in side view, shows the Detail 1 in FIG. 3/3.3 on an enlarged scale, and FIG. 5 shows the production of a solar module (photovoltaic element) in six successive stages.

DETAILED DESCRIPTION OF THE INVENTION

The method shown as an example in FIG. 1 proceeds as follows:

1. Applying Diffusion-Tight Edge Coating Material (Bead 8)

A bead 8 that consists of, e.g., diffusion-tight sealing material is applied on all four sides on the edge on the surface of glass pane 7 surface (first component) in a vertical or horizontal application system. Contours or inside cutaways can also be surrounded with a bead 8 with this application system.

1.1 Edge coating material 8 is applied as a bead on a glass pane 7 (first component) (FIG. 1).
   1.2 Edge coating material 8 is applied on an already pre-laminated 9 glass pane 7 (FIG. 2).
   1.3 Edge coating material 8 is applied on a coated glass pane 10 7 (for the production of thin-layer PV modules) (FIG. 3).

2. Fittings

Depending on the vacuum element (modular design) to be produced, various inserts (fittings) are inserted into the sealed pane manually or automatically.

2.1 For vacuum glass production (empty vacuum element, i.e., without fittings), vacuum glass spacers 11 are inserted ionto the sealed 8 glass pane 7 (first component) provided with bead 8 (FIG. 1).
   2.2 For PV modular production, either a composite film 9 (i.e., a film that binds the components of the vacuum element together) and wafers or thin-layer films 12 are inserted ionto a glass pane 7 that is provided with a bead 8 (FIG. 2), or only the wafers or the thin-layer films 12 are inserted into the already sealed 8, prelaminated 9 glass pane 7 (FIG. 3) provided with bead 8.

3. Assembly

During assembly, the rear-side glass panes 7 (second component) and optionally necessary composite films 9 are put into place on the pre-fabricated elements. By the special application (see Detail 1IV in FIG. 4) of the bead 8 that consists of sealing compound 8, the rear-side glass pane 7 (second component) rests only at points 25 on the bead 8 made of edge coating compound 8 that acts as a sealing cord, so that a vacuum can be produced in the interior of the element via the gap 13 that develops (essentially running all around).

3.1 In the vacuum glass production, only a second glass pane 7 (second component) is positioned on the bead 8 that consists of edge coating compound 8 that is used as a sealing cord (FIG. 1).
   3.2 In the production of PV modules with wafers or thin-layer films 12, another composite film 9 is also inserted in addition to the rear-side glass pane 7 (FIG. 2).
   3.3 In the production of thin-layer glass modules 10, depending on the modular design, a composite film 9 is inserted or even not inserted for connecting the two glass panes 7 (FIG. 3).

4. Transport into the Chamber 20 and Negative Pressure Generation

After the pre-fabricated elements have been positioned on the intake table in front of a pressing chamber 20, they are transported into the pressing chamber 20 either via a conveyor belt or another linear conveying device. Then, the flaps 21 (Part 3) of the chamber 20 (Part 3) are tightly sealed, and the vacuum pump 23 (Part 1) begins to evacuate the chamber 20.

5. Pressing a Bead 8 Made of an Edge Coating Compound (Depending on the Film Type with Temperature Increase or without Temperature Increase)

After reaching the desired final pressure in the chamber 20, the movable press plate 24 (Part 2) is moved downward and, in so doing, presses the two glass panes 7 tightly together. In this process, a temperature input is necessary with certain film types 9 (autoclave-free films).

6. Removing Vacuum, Raising Press Plate 24, Opening Chamber 20, and Extract

After the pressing process has taken place, the vacuum pump 23 (Part 1) is cut off, the press plate 24 (Part 2) is raised, and the vacuum element is slowly exposed to the prevailing atmospheric pressure. The flaps 21 (Part 3) are opened, and the finished vacuum element is transported in the direction of the output table (Part 5).

Depending on the composite film type, an autoclave process can then be carried out to finish the module.

The above-mentioned composite film 9 is preferably a single-layer film and consists in particular of polyvinyl butyral (PVB).

In the variant of the method according to the invention, in which a coated glass 7 (with thin-layer photovoltaics) is used as a first component, the insertion of photovoltaic wafers 12 is eliminated, as in the method of FIG. 2.

The bead 8, which is also attached in the first component 7 along its periphery relative to the latter, preferably offset inward, consists of, for example, sealing material that is common in insulating glass manufacturing (in most cases a hardening polysulfide) or else a diffusion-tight adhesive, such as (reactive) HotMelt (hot melt adhesive, e.g., based on ethylene-vinyl-acetate, based on polyester, or based on polyamide).

The vacuum glass spacers 11 attached within the bead, provided in one embodiment, which are used in particular when no fittings in the form of a solar module and/or a solar collector are arranged in the vacuum element and which prevent the components (glass panes 7) from curving inward by the inside surfaces of the components resting on the vacuum glass spacers 11 and being kept at a distance from the latter, consist of, for example, glass or another translucent material.

As spacers 25, which produce the gap 13 that is provided at least in one part of the edge of the flat components 7, pins, U-shaped clips and the like that are inserted into the bead can also be used. Spacers 25, regardless of what type, are preferred within the scope of the invention but are not essential, since it is only essential that at least one gap 13 is present on the edge of the flat components, a gap that allows the evacuation of the inside space.

The above-mentioned treatment in the autoclave is preferably done at a temperature that is sufficient to activate the composite film that consists of polyvinyl butyral (PVB), so that the components are glued to one another with inserted solar modules (solar collectors).

The procedure shown in six stages in FIG. 5 can be described as follows for producing a photovoltaic module:

First, a bead 8 that consists of adhesive material (e.g., HotMelt adhesive) is applied on a glass pane 7 in the area of the periphery of the same. As a next step, a composite film 9 is put into place within the area edged by the bead 8 that consists of adhesive. Here, the photovoltaic elements 12 (solar cells) are put into place on the composite film 9. Another composite film 9 is put into place on the arrangement that is thus obtained. As an alternative, instead of the additional composite film, a liquid, e.g., a liquid silicone or a granulate, can be applied. In any case, the liquid that is used instead of the film that is put into place on the second composite film can be a solution of a material that performs the function of a composite film, e.g., silicone, whose solvent is evaporated in the subsequent step of heating and evacuation. If a granulate, e.g., a silicone granulate, is applied, the latter melts and performs the function of the additional composite film 9.

Regardless of whether another film 9 or a granulate or a liquid is applied to the solar cells 12 that are put into place, as a next step, another glass pane 7 is put into place, and the thus obtained arrangement—consisting of two glass panes, between which in the periphery area a bead that consists of adhesive is present and between which a lower and an upper composite film (instead of the upper composite film, a liquid can also be provided, such as a silicone) are present—is heated and pressed in a vacuum, so that the arrangement shown in the last image (5, 6) of FIG. 5 is produced, in which the upper film (or the liquid or the granulate) became translucent to allow light to strike the solar cells, and the solar cells are partially embedded in the lower composite film and the upper composite film.

Regardless of whether—in the (vacuum) element according to the invention between the flat components arranged outside—at least one polymer film, preferably two polymer films (e.g., composite film), a solution of a substance that binds the components (e.g., silicone) or a granulate of a substance that binds the components (e.g., silicone granulate) is provided or introduced, after the pressing in the vacuum in the finished (vacuum) element according to the invention, an interior space that is in particular completely filled by the substance is produced, whereby the fittings between the flat components (glass panes) are held securely. In addition, it is achieved that the flat components are connected securely and permanently to one another.

In summary, an embodiment of the invention can be described as follows.

For the production of vacuum elements, which optionally contain fittings in the form of at least one solar module (photovoltaic element) and/or one solar collector or a display element, negative pressure is produced in a space between two flat components, in particular translucent or transparent plates, such as glass panes, which are bound together via a bead made of sealing material, such that an arrangement that consists of a first component provided with a bead and at a distance therefrom but parallel to the second component arranged therein, is introduced into a vacuum chamber and pressed under vacuum. In this case, an elevated temperature also optionally can be applied to laminate films provided between the components with the components and optionally present fittings.

The invention claimed is:

1. A method for producing elements that comprise at least first and second flat components (7), which are arranged parallel to one another in the element and at a distance from one another, whereby space between the flat components (7) is limited by a bead (8) that runs all around and whereby pressure in the space between the flat components (7) is reduced relative to ambient pressure, said method comprising the steps of:
    application of a bead (8) along a periphery of a first of said flat components (7);
    providing spacers (25) having a height, measured normal to a plane of the first flat component (7), greater than a thickness of the bead (8);
    putting a second of said flat components (7) in place, wherein the second flat component (7) is at least in places at a distance from the bead (8) such that all around openings (13) for release of air from the space between the first and second flat components (7) and the bead (8) are provided in a thus obtained arrangement;
    introducing the arrangement that comprises the first and second flat components (7) in a chamber (20);
    production of negative pressure in the chamber (20) and, by removing the air from the space between the first and second flat components (7) via the all around openings (13), within the interior space between the first and second flat components (7);
    pressing the arrangement in the chamber (20), with the negative pressure maintained at a pressure that is reduced relative to the ambient pressure, until the second flat component (7) rests on the bead (8) and the first flat component (7) and the second component (7) are all around sealingly connected via the bead (8) to form a pressed element;
    removing negative pressure in the chamber (20); and
    taking the pressed element from the chamber (20).

2. The method according to claim 1, wherein the bead (8) comprises a diffusion-tight compound.

3. The method according to claim 1, wherein the spacers (25) are provided to form areas of the bead (8) that are thickened in places.

4. The method according to claim 1, a least one thin-layer photovoltaic module (12) is provided in the space between the flat components (7) and within a perimeter defined by the bead (8).

5. The method according to claim 1, wherein one of the group consisting of a composite film (9), a liquid silicone, a dissolved silicone, and a granulate is arranged on the first component (7) in the space between the flat components (7) and within a perimeter defined by the bead (8).

6. The method according to claim 1, wherein,
    a first layer (9) with one of the group consisting of a composite film, a liquid silicone, a dissolved silicone, and a granulate is formed on the first component (7) in the space between the flat components (7) and within a perimeter defined by the bead (8), and
    at least one (12) of the group consisting of i) a least one thin-layer photovoltaic module, ii) at least one solar cell iii) at least one solar collector, and iv) at least one display element, is provided on the first layer in the space between the flat components (7) and within a perimeter defined by the bead (8).

7. The method according to claim 1, wherein,
    a first layer (9) with one of the group consisting of a composite film (9), a liquid silicone, a dissolved silicone, and a granulate is formed on the first component (7) in the space between the flat components (7) and within a perimeter defined by the bead (8),
    at least one, (12) of the group consisting of i) a least one thin-layer photovoltaic module, ii) at least one solar cell iii) at least one solar collector, and iv) at least one display element, is provided on the first layer in the space between the flat components (7) and within a perimeter defined by the bead (8), and
    a second layer (9) with another one of the group consisting of a composite film (9), a liquid silicone, a dissolved silicone, and a granulate is formed on the least one unit (12) in the space between the flat components (7) and within a perimeter defined by the bead (8).

8. The method according to claim 7, wherein, in said pressing step, the arrangement is pressed until the second flat component (7) rests on the a layer (9) formed by the other one of the group consisting of a composite film (9), a liquid silicone, a dissolved silicone, and a granulate arranged on the least one thin-layer photovoltaic module (12).

9. The method according to claim 6, comprising a further step of heating the arrangement prior to said pressing step.

10. The method according to claim 1, wherein at least one of the first and second flat components (7) is a translucent material.

11. The method according to claim 1, wherein at least one of the first and second flat components (7) comprises a hardened glass.

12. The method according to claim 11, comprising a further step of subjecting the pressed element taken from the chamber (20) to a thermal treatment in an autoclave.

13. The method according to claim 1, wherein the bead comprises a diffusion-tight material selected from the group consisting of butyl rubber, hot-melt adhesive, component adhesive, sealing compound based on polysulfide, a metal that can be soldered with glass, and tin.

14. The method according to claim 2, wherein vacuum glass spacers (11) are inserted within the bead (8).

15. A method for producing a pressed element having an interior space at a reduced pressure relative to ambient pressure, said method comprising the steps of:

provided a first flat component (7), the first flat component being solar glass;

applying of a bead (8), of a first thickness measured normal to a plane of the first flat component (7), along a periphery of the first flat component (7);

providing spacers (25) in the bead (8), the spacers (25) having a height, measured normal to the plane of the first flat component (7), greater than the first thickness of the bead (8);

providing at least one unit (12) of the group consisting of i) a least one thin-layer photovoltaic module, ii) at least one solar cell, iii) at least one solar collector, and iv) at least one display element, on the first flat component (7) within a perimeter defined by the bead (8);

putting a second flat component (7) in place over the at least one unit (12) and resting on the spacers (25) so that the second flat component (7) is, at least in places, at a spaced-apart distance from the bead (8) such that all around openings (13) for release of air from an interior space between the first and second flat components (7) and the bead (8) are formed in a thus-obtained arrangement;

introducing the arrangement into a pressing chamber (20);

producing a negative pressure relative to ambient pressure in the pressing chamber (20) and, by removing the air from the space between the first and second flat components (7) via the all around openings (13), within the interior space between the first and second flat components (7);

using a press plate, pressing the arrangement in the chamber (20), with the negative pressure maintained at a pressure that is reduced relative to the ambient pressure, until the second flat component (7) rests on the bead (8) and the first flat component (7) and the second component (7) are all around sealingly connected via the bead (8) to form a pressed element, the spacers and the all around openings (13) having been eliminated in the pressing step;

removing negative pressure in the chamber (20); and taking the pressed element from the chamber (20), the interior space of the pressed element being at a reduced pressure relative to ambient pressure.

\* \* \* \* \*